(12) United States Patent
Shim et al.

(10) Patent No.: US 7,977,695 B2
(45) Date of Patent: Jul. 12, 2011

(54) SEMICONDUCTOR LIGHT EMITTING DEVICE AND METHOD FOR MANUFACTURING THE SAME

(75) Inventors: Sang Kyun Shim, Jeonju-si (KR); Ho Sang Yoon, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 292 days.

(21) Appl. No.: 12/234,326

(22) Filed: Sep. 19, 2008

(65) Prior Publication Data

US 2009/0078954 A1 Mar. 26, 2009

(30) Foreign Application Priority Data

Sep. 21, 2007 (KR) .................. 10-2007-0096392
Nov. 8, 2007 (KR) .................. 10-2007-0113915

(51) Int. Cl.
*H01L 33/00* (2010.01)
(52) U.S. Cl. .................. 257/98; 257/E33.059

(58) Field of Classification Search .................. 257/98, 257/E33.06, E33.067, E33.061, E33.059
See application file for complete search history.

(56) References Cited

U.S. PATENT DOCUMENTS

| 2004/0109105 A1* | 6/2004 | Nagakubo et al. | 349/65 |
| 2005/0248702 A1* | 11/2005 | Hoshino | 349/113 |
| 2005/0274969 A1* | 12/2005 | Suzuki | 257/98 |
| 2008/0008964 A1* | 1/2008 | Chan et al. | 430/270.13 |
| 2008/0024402 A1* | 1/2008 | Nishikawa et al. | 345/82 |
| 2008/0042154 A1* | 2/2008 | Wano | 257/98 |

* cited by examiner

*Primary Examiner* — Thao P. Le
(74) *Attorney, Agent, or Firm* — Birch, Stewart, Kolasch & Birch, LLP (57) ABSTRACT

Disclosed is a semiconductor light emitting device and a method for manufacturing the same. The semiconductor light emitting device comprises a first conductive semiconductor layer comprising a first concave-convex pattern, a second concave-convex pattern on at least one pattern of the first concave-convex pattern, an active layer on the first conductive semiconductor layer, and a second conductive semiconductor layer on the active layer.

22 Claims, 9 Drawing Sheets

SEMICONDUCTOR LIGHT EMITTING DEVICE AND METHOD FOR MANUFACTURING THE SAME

The present application claims priority under 35 U.S.C. 119 to Korean Patent Application No. 10-2007-0096392 (filed on Sep. 21, 2007) and 10-2007-113915 (field on Nov. 8, 2007), which is hereby incorporated by reference in its entirety.

BACKGROUND

The present disclosure relates to a semiconductor light emitting device and a method of manufacturing the same.

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an LD (laser diode), and studies have been continuously conducted to improve the manufacturing process or a light efficiency of the nitride semiconductor.

SUMMARY

The embodiment provides a semiconductor light emitting device and a method for manufacturing the same, capable of forming a concave and/or convex pattern on a substrate, and forming a fine concave-convex pattern on the surface of the concave and/or convex pattern.

The embodiment provides a semiconductor light emitting device and a method for manufacturing the same, capable of improving light efficiency by forming a concave-convex pattern with a step-type concave-convex structure on a substrate.

The embodiment provides a semiconductor light emitting device and a method for manufacturing the same, capable of enhancing resistance against electrostatic discharge (ESD) and preventing an active layer from being degraded by exposing a plurality of [0001] surfaces on a pattern on a substrate.

The embodiment provides a semiconductor light emitting device and a method for manufacturing the same, capable of improving light efficiency by forming a concave pattern on a semiconductor layer under an active layer and forming a surface of the concave pattern with a fine concave-convex structure.

An embodiment provides a semiconductor light emitting device comprising: a first conductive semiconductor layer comprising a first concave-convex pattern, a second concave-convex pattern on at least one pattern of the first concave-convex pattern, an active layer on the first conductive semiconductor layer, and a second conductive semiconductor layer on the active layer.

An embodiment provides a semiconductor light emitting device comprising: a substrate comprising a first convex pattern, a second concave-convex pattern on the first convex pattern, a first conductive semiconductor layer on the substrate, an active layer on the first conductive semiconductor layer, and a second first conductive semiconductor layer on the active layer.

An embodiment provides a method for manufacturing a semiconductor light emitting device, comprising: forming first concave-convex pattern on a substrate, forming a second concave-convex pattern on the first convex pattern, forming a first conductive semiconductor layer on the substrate, forming an active layer on the first conductive semiconductor layer, and forming a second conductive semiconductor layer on the active layer.

DETAILED DESCRIPTION OF THE EMBODIMENTS

A semiconductor light emitting device and a method for manufacturing the same according to an embodiment will be described in detail with reference to the accompanying drawings. In the description of embodiments, it will be understood that when a layer is referred to as being 'on' or 'under' another layer, the reference about 'on' and 'under' each layer will be made on the basis of drawings. Also, the thickness of each layer in the drawings is an example, and is not limited thereto.

Figure 1:
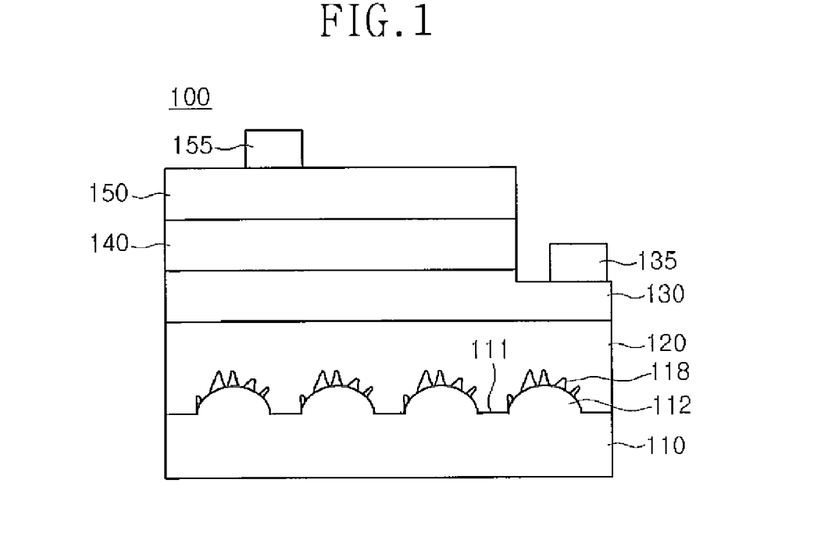
FIG. 1 is a side sectional view showing a semiconductor light emitting device according to a first embodiment.

FIG. 1 is a side sectional view showing a semiconductor light emitting device according to a first embodiment.

Referring to FIG. 1, the semiconductor light emitting device 100 comprises a substrate 110, a buffer layer 120, a first conductive semiconductor layer 130, an active layer 140, and a second conductive semiconductor layer 150.

The substrate 110 may comprise one selected from the group consisting of $Al_2O_3$, GaN, SiC, ZnO, Si, GaP, and GaAs, and may comprise a conductive substrate. The substrate 110 may be removed before or after an electrode is formed.

The substrate 110 is provided thereon with first concave and convex patterns 111 and 112. A second concave-convex pattern 118 is formed on a surface of the first convex patterns 112 of the first concave and convex patterns 111 and 112. The first concave patterns 111 of the first concave and convex patterns 111 and 112 may have a flat surface, and the first convex patterns 112 have a convex shape with respect to the first concave patterns 111.

The first convex pattern 112 may comprise one of a convex-lens shape, a conical shape, a polygonal shape, and a stripe shape. The plural first convex patterns 112 may be formed with a regular interval or an irregular interval, and the shape and the interval may be changed.

The second concave-convex pattern 118 formed on the surface of the first convex pattern 112 may comprise a nitride semiconductor such as GaN, InN, or InGaN, and may have a nanometer size. In addition, the second concave-convex patterns 118 are formed with a random interval, and have a random shape. However, the second concave-convex patterns 118 may have a micro-lens shape.

The substrate 110 is formed thereon with the buffer layer 120 to reduce a lattice constant difference from the substrate 110. The buffer layer 120 may selectively comprise GaN, AlN, AlGaN, or InGaN. The buffer layer 120 may be formed with an undoped semiconductor layer (not shown). The undoped semiconductor layer (not shown) may be realized by using an undoped GaN layer. The substrate 110 may be formed thereon with only one of the buffer layer 120 and the undoped semiconductor layer (not shown), or the above layers may not be formed on the substrate 110.

The buffer layer 120 is formed thereon with the first conductive semiconductor layer 130. The first conductive semiconductor layer 130 may comprise an N-type semiconductor layer doped with N-type dopants. The N-type semiconductor layer may comprise a semiconductor material, such as InAlGaN, GaN, AlGaN, InGaN, AlN, or InN, having a compositional formula of $In_xAl_yGa_{1-x-y}N$ ($0 \leq x \leq 1$, $0 \leq y \leq 1$, $0 \leq x+y \leq 1$). The N-type dopants comprise Si, Ge, and Sn.

The active layer 140 is formed on the first conductive semiconductor layer 130, and may have a single or multiple quantum well structure. A conductive clad layer (not shown) may be formed on and/under the active layer 140. The conductive clad layer may be realized by using an AlGaN layer.

The second conductive semiconductor layer 150 is formed on the active layer 140. The second conductive semiconductor layer 150 may be realized by using a P-type semiconductor layer doped with P-type dopants. The P-type semiconductor layer may comprise a semiconductor material, such as InAlGaN, GaN, AlGaN, InGaN, AlN, or InN, having a compositional formula of $In_xAl_yGa_{1-x-y}N$ ($0 \leq x \leq 1$, $0 \leq y \leq 1$, $0 \leq x+y \leq 1$). The P-type dopants comprise Mg, Zn, Ca, Sr, and Ba.

A first electrode layer 135 may be formed on the first conductive semiconductor layer 130, and a second electrode layer 155 maybe formed on the second conductive semiconductor layer 150.

The second conductive semiconductor layer 150 may be formed thereon with a transparent electrode layer. The second conductive semiconductor layer 150 may be formed thereon with an N-type semiconductor layer and/or a transparent layer. According to the embodiment, the light emitting device may have one of a P—N junction structure, an N—P junction structure, an N—P—N junction structure, and a P—N—P junction structure. Hereinafter, for the purpose of explanation, the P—N junction structure may be described.

In the semiconductor light emitting device 100, the substrate 110 is formed thereon with the first convex pattern 112, and the first convex pattern 112 is formed on the surface thereof with the second concave-convex pattern 118 comprising a nitride semiconductor. The second concave-convex pattern 118 comprises a concave-convex structure on the surface of the first convex pattern 112 of the substrate 110, so that a critical angle of light may be changed by the first convex pattern 112 and the second concave-convex pattern 118. In other words, the critical angle of the light incident onto or transmitted from the surface of the substrate 110 is reduced to enhance light extracting efficiency. Accordingly, external quantum efficiency can be improved.

FIGS. 2 to 8 are views showing the manufacturing process of the semiconductor light emitting device according to the first embodiment.

Figure 2:
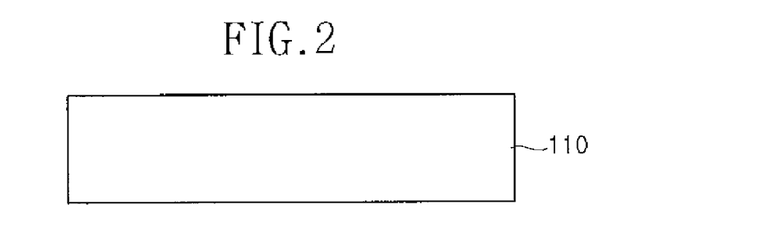
FIGS. 2 to 8 are views showing the manufacturing process of the semiconductor light emitting device according to the first embodiment.
Figure 3:
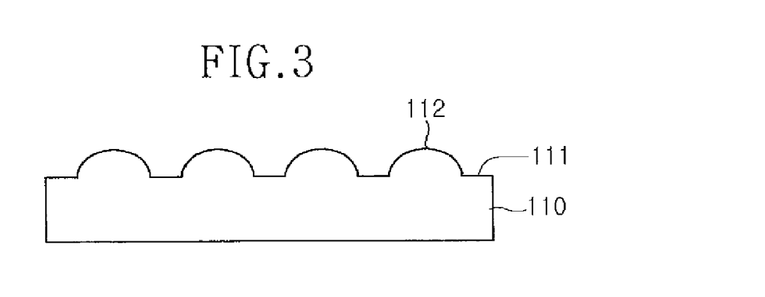

Referring to FIGS. 2 and 3, the surface of the substrate 110 is etched through a first etching process, thereby forming the first concave and convex patterns 111 and 112. The substrate 110 comprises one selected from the group consisting of $Al_2O_3$, GaN, SiC, ZnO, Si, GaP, and GaAs. If the substrate 110 comprises $Al_2O_3$, the first concave and convex patterns 111 and 112 may comprise a patterned sapphire substrate (PSS) having a convex lens shape.

The first etching process for the substrate 110 may be performed as a dry etch scheme by using equipment for reactive ion etching (RIE), equipment for capacitively coupled plasma (CCP), equipment for electron cyclotron resonance (ECR), or equipment for inductively coupled plasma (ICP).

Figure 4:
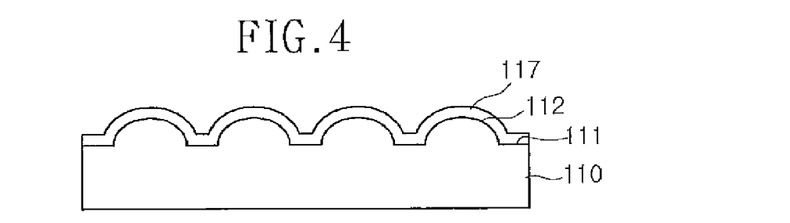
Figure 5:
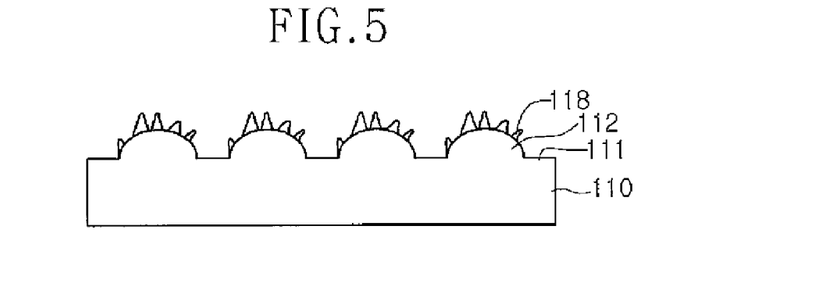
Figure 6:
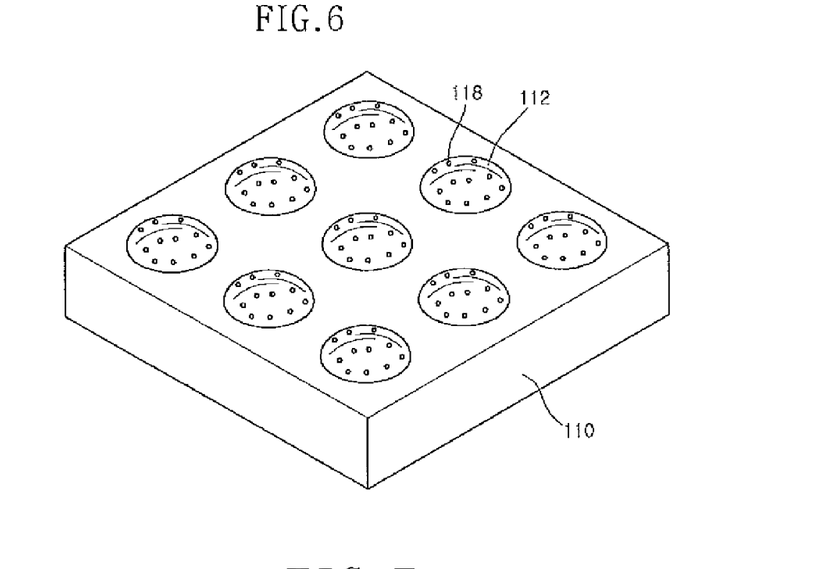

Referring to FIGS. 4 to 6, a sacrificial layer 117 is formed on the substrate 110. The sacrificial layer 117 may comprise a nitride semiconductor, such as GaN, InN, or InGaN. The sacrificial layer 117 may comprise an undoped semiconductor layer or a layer doped with N-type dopants and/or P-type dopants. The sacrificial layer 117 may comprise a thin film having a thickness of several nm to several thousand nm (e.g., about 5 nm to about 3000 nm), Then, a second etching process is performed with respect to the sacrificial layer 117. The second etching process comprises a primary heat treatment process and a secondary wet etch process. The primary heat treatment process is performed by applying $H_2$, $N_2$, or the mixture of $H_2$ and $N_2$ in a chamber under a high temperature. In the nitride semiconductor of the sacrificial layer 117, a coupling force between semiconductor lattices is weakened due to the high temperature heat treatment process, and the semiconductor lattices are separated from each other. For example, nitride in a predetermined portion of the semiconductor lattice of the GaN sacrificial layer 117, which is significantly affected by heat, may be decomposed, so that the nitride is separated from the semiconductor lattice. In this case, the temperature of the primary heat treatment process corresponds to the temperature sufficient for separating the GaN lattices from each other, and may be in the range 1200° C. to 1500° C.

Then, the secondary wet etch process is performed while boiling the sacrificial layer 117 by using KOH solution. At this time, a portion of the sacrificial layer 117 having a coupling force weakened through the primary heat treatment process is separated from the sacrificial layer 117. Accordingly, a portion of the sacrificial layer 117 remains on the surface of the first convex pattern 112 in the shape of a micro-lens. Solution for the wet etch process can decompose the nitride semiconductor, and may comprise KOH solution or NaOH solution.

A second concave-convex pattern (not shown) having a micro-lens shape may be formed on a surface of the first concave pattern 111 of the substrate 110. In other words, the second concave-convex pattern 118 may be formed on the surface of the first concave pattern 111 and the second convex pattern 112 due to a difference in a coupling force of the sacrificial layer 117.

Even if the second etch process is performed with respect to the sacrificial layer 117, the surface of the first convex pattern 112 of the substrate 110 is not deformed, but the second concave-convex pattern 118 having a fine concave-convex structure exists on the surface of the first convex pattern 112. The second concave-convex pattern 118 having a nano size is formed on the surface of the first convex pattern 112.

Figure 7:
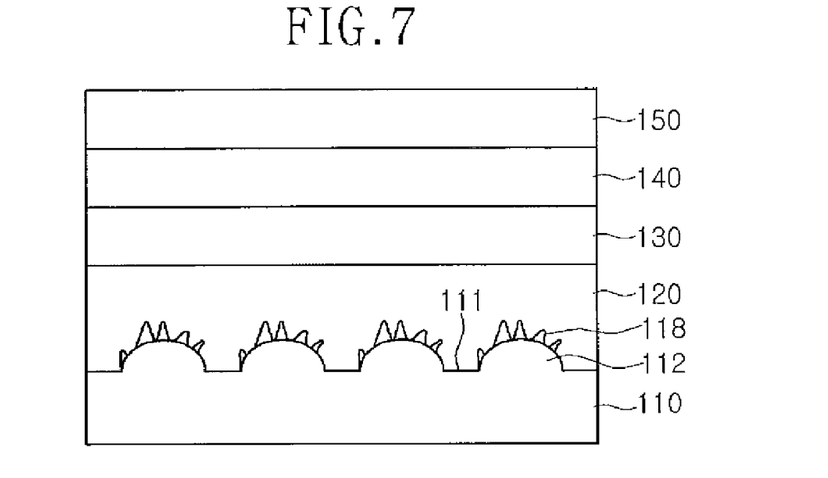

Referring to FIG. 7, a nitride semiconductor is grown on the substrate 110. The nitride semiconductor maybe grown by an electronic beam depositor, physical vapor deposition (PVD), chemical vapor deposition (CVD), plasma laser deposition (PLD), a dual-type thermal evaporator, sputtering, or metal organic chemical vapor deposition (MOCVD), but the embodiment is not limited thereto.

The buffer layer 120 is formed on the substrate 110, and the first conductive semiconductor layer 130, the active layer 140, and the second conductive semiconductor layer 150 are sequentially formed on the buffer layer 120.

The buffer layer 120 may selectively comprise GaN, AlN, AlGaN, or InGaN. The buffer layer 120 may be formed thereon with an undoped semiconductor layer (not shown), and is not limited thereto.

The buffer layer 120 is formed thereon with the first conductive semiconductor layer 130. For example, the first conductive semiconductor layer 130 may comprise an N-type semiconductor layer doped with N-type dopants. The N-type semiconductor layer may comprise a semiconductor material, such as InAlGaN, GaN, AlGaN, InGaN, AlN, or InN, having a compositional formula, $In_xAl_yGa_{1-x-y}N$ ($0 \leq x \leq 1$, $0 \leq y \leq 1$, $0 \leq x+y \leq 1$). The N-type dopants comprise Si, Ge, and Sn.

The first conductive semiconductor layer 130 is formed thereon with the active layer 140. The active layer 140 may have a single quantum well structure or a multiple single quantum well structure. The active layer 140 may have various light emitting wavelengths of blue, red, and green light according to light emitting materials, and is not limited thereto.

A conductive clad layer (not shown) may be formed above and/or under the active layer 140. The conductive clad layer may be realized by using an AlGaN layer.

The second conductive semiconductor layer 150 is formed on the active layer 140. The second conductive semiconductor layer 150 may be realized by using a P-type semiconductor layer doped with P-type dopants. The P-type semiconductor layer may comprise a semiconductor material, such as InAlGaN, GaN, AlGaN, InGaN, AlN, or InN, having a compositional formula, $In_xAl_yGa_{1-x-y}N$ ($0 \leq x \leq 1$, $0 \leq y \leq 1$, $0 \leq x+y \leq 1$). The P-type dopants comprise Mg, Zn, Ca, Sr, and Ba.

In addition, the second conductive semiconductor layer 150 may be formed thereon with an N-type semiconductor layer (not shown) and/or a transparent electrode layer (not shown).

Figure 8:
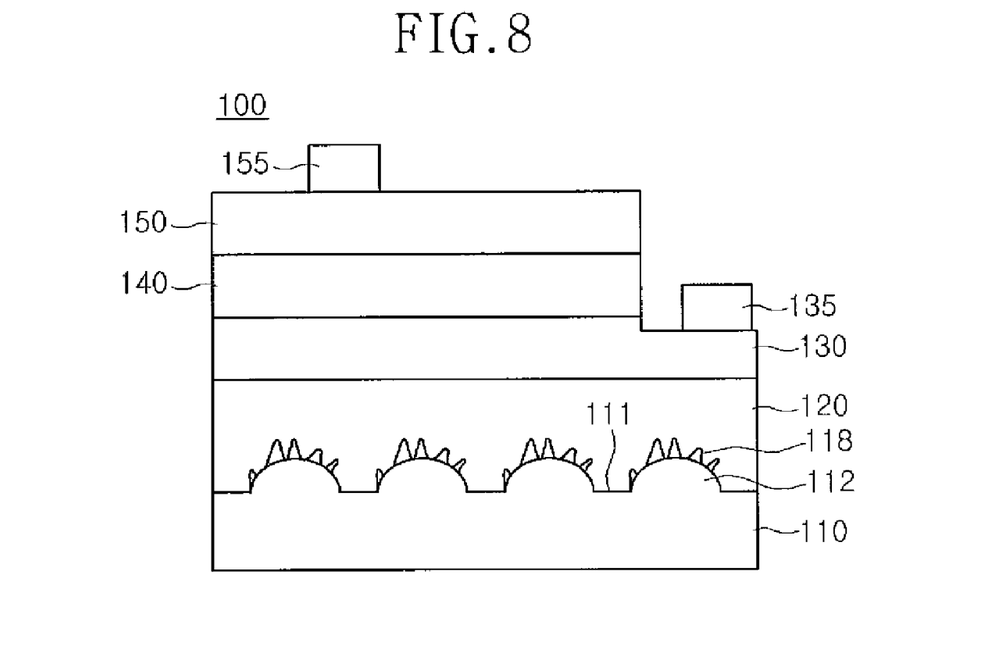

Referring to FIG. 8, after performing a mesa etch process, the first electrode layer 135 may be formed on the first conductive semiconductor layer 130, and the second electrode layer 155 may be formed on the second conductive semiconductor layer 150.

In the semiconductor light emitting device 100, the first concave and convex patterns 111 and 112 are formed on the substrate 110, and the second concave-convex pattern 118 having a nano size are formed on the surface of the first convex pattern 112 of the first concave and convex patterns 111 and 112, thereby extracting photons to raise light efficiency.

Figure 9:
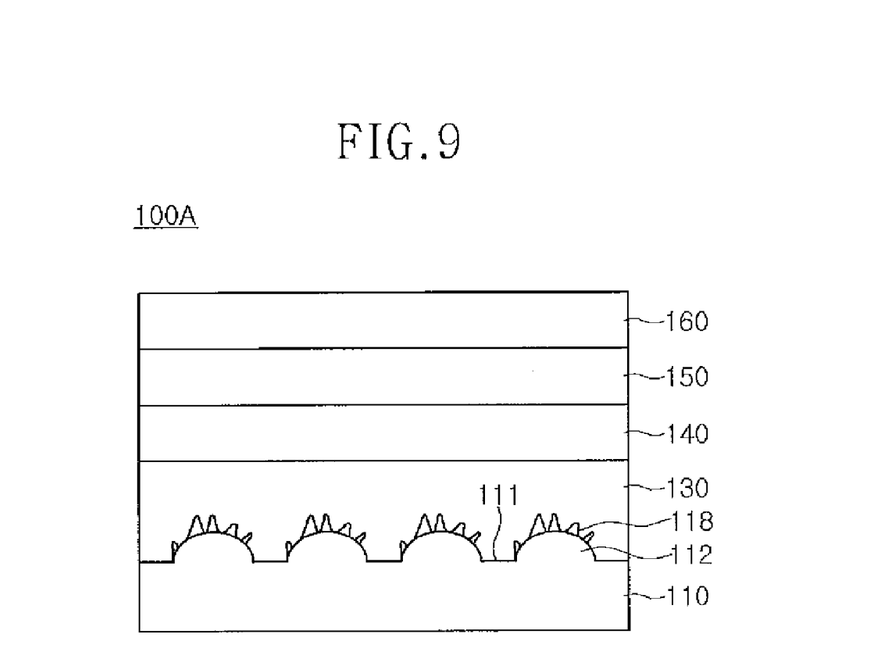
FIG. 9 is a side sectional view showing a semiconductor light emitting device according to a second embodiment.

FIG. 9 is a side sectional view showing a semiconductor light emitting device 100A according to a second embodiment. In the following description about the second embodiment, the same reference numerals are assigned to elements identical to those of the first embodiment, and details thereof will be omitted.

Referring to FIG. 9, in the semiconductor light emitting device 100A, the first conductive semiconductor layer 130 is formed on the substrate 110, and the third conductive semiconductor layer 160 is formed on the second conductive semiconductor layer 150. The substrate 110 is formed thereon with first concave and convex patterns 111 and 112, and the second concave convex pattern 118 having a nano size and comprising a nitride semiconductor (e.g., GaN, InN, and InGaN) is formed on the surface of the first convex pattern 112.

The first and third conductive semiconductor layers 130 and 160 may comprise an N-type semiconductor layer, and the second conductive semiconductor layer 150 may comprise a P-type semiconductor layer. In this case, the N-type semiconductor layer or the P-type semiconductor layer may be selected among InAlGaN, GaN, AlGaN, InGaN, AlN, and InN, and is not limited thereto.

The third conductive semiconductor layer 160 may be formed thereon with a second electrode layer (not shown) or a transparent electrode layer (not shown)/the second electrode layer. A first electrode layer (not shown) may be formed on or under the first conductive semiconductor layer 130. The substrate provided under the first conductive semiconductor layer 130 may be removed through a laser lift-off (LLO) scheme.

According to the second embodiment, the semiconductor light emitting device 100A has an N—P—N structure. The first concave and convex patterns 111 and 112 are formed on the substrate 110 and the second concave-convex pattern 118 having a nano size is formed on the surface of the first convex pattern 112, thereby improving external quantum efficiency.

Figure 10:
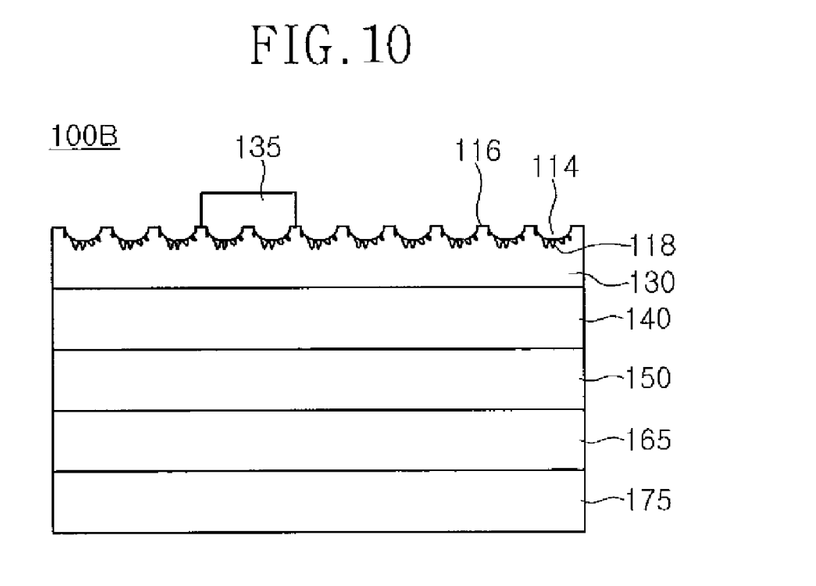
FIG. 10 is a side sectional view showing a semiconductor light emitting device according to a third embodiment.

FIG. 10 is a side sectional view showing a semiconductor light emitting device 100B according to a third embodiment.

Referring to FIG. 10, the semiconductor light emitting device 100B comprises a vertical structure. In the following description about the third embodiment, the same reference numerals are assigned to elements identical to the above embodiments, and details thereof will be omitted. In addition, the position of "on" or "under" will be explained based on accompanying drawings.

In the semiconductor light emitting device 100B, a reflective electrode layer 165 is formed under the second conductive semiconductor layer 150, and a conductive support substrate 175 is formed under the reflective electrode layer 165. The reflective electrode layer 165 may comprise one of Al, Ag, Pd, Rh, and Pt, and the conductive support substrate 175 may comprise Cu or Au. The embodiment is not limited thereto.

In this case, the substrate 110 shown in FIG. 7 is removed through a physical removal scheme. In order to physically remove the substrate 110, a laser beam having a predetermined wavelength is irradiated to the substrate 110 to separate the substrate 110 from a remaining structure. In addition, a buffer layer (not shown) is formed between the substrate 110 and the first conductive semiconductor layer 130, and the buffer layer may be removed through a wet or dry etch scheme. In addition, in order to chemically remove the buffer layer, etching solution may be applied to the buffer layer to remove the buffer layer. Then, the first electrode layer 135 may be formed on the first conductive semiconductor layer 130.

The substrate (see 110 of FIG. 7) is removed to form third concave and convex patterns 114 and 116 on the surface of the first conductive semiconductor layer 130. The third concave pattern 114 of the third concave and convex patterns 114 and 116 comprises at least one of a concave-lens shape, a polygonal shape, a conical shape, and a stripe shape. If the third concave pattern 114 is the concave-lens shape, the second concave-convex pattern 118 comprising a nitride semiconductor (e.g., GaN, InN, and InGaN) is formed under the third concave pattern 114. In other words, when the substrate (see 110 of FIG. 7) and the first concave and convex patterns (see 111 and 112 of FIG. 7) are separated from the first conductive semiconductor layer 130, the third concave and convex patterns 114 and 116 are formed on the first conductive semiconductor layer 130 corresponding to the first concave and convex patterns (see 111 and 112 of FIG. 7). In addition, the second concave-convex pattern 118 having a nano size and comprising the nitride semiconductor remains under the third concave pattern 114.

When the second concave-convex pattern (not shown) is formed on the surface of the first concave pattern (see 111 of FIG. 7), the second concave-convex pattern (not shown) may be formed under the first convex pattern 116.

In the semiconductor light emitting device 100B, the third concave and convex patterns 114 and 116 are formed on the first conductive semiconductor layer 130, and the second concave-convex pattern 118 is formed under the third concave pattern 114, thereby reducing a critical angle of incident light. Accordingly, external quantum efficiency can be improved.

Figure 11:
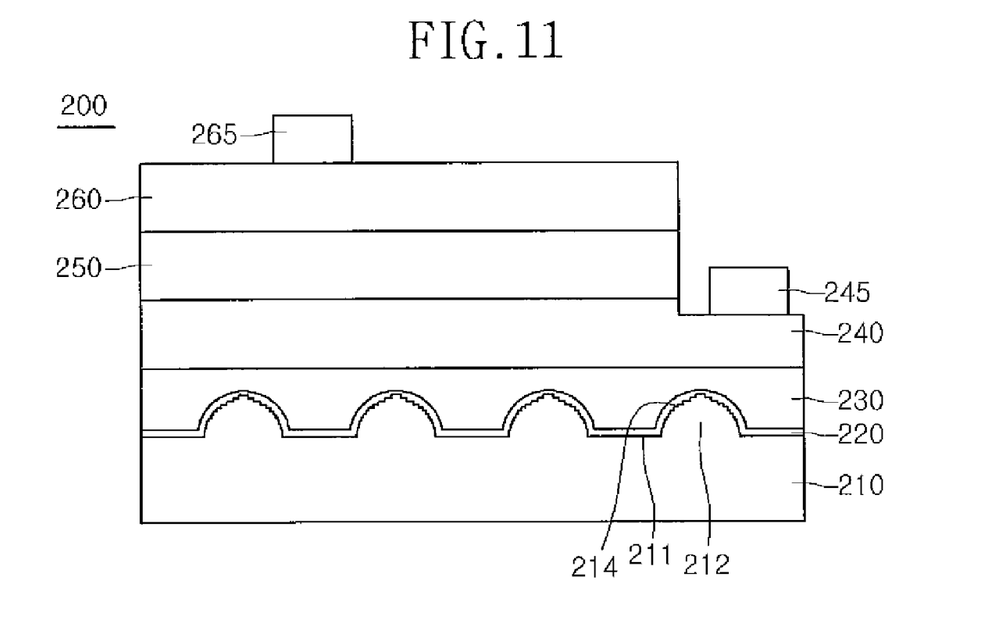
FIG. 11 is a side sectional view showing a semiconductor light emitting device according to a fourth embodiment.
Figure 12:
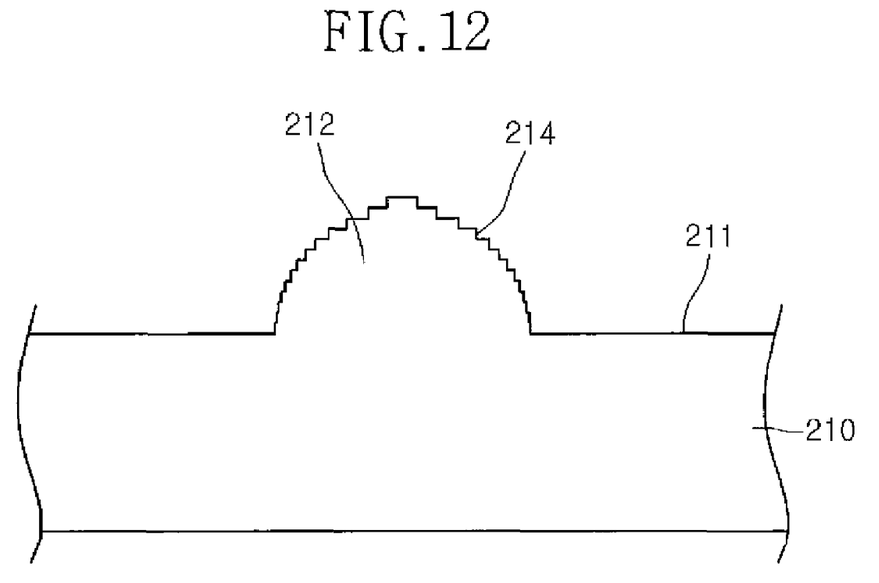
FIG. 12 is a side sectional view showing fourth concave and convex patterns of a substrate shown in FIG. 11.
Figure 13:
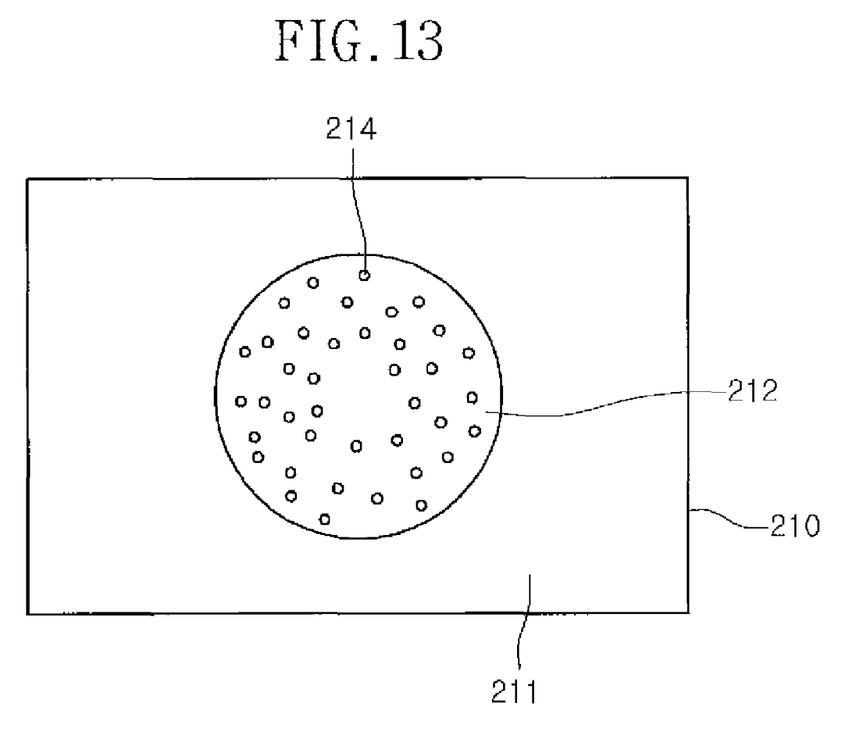
FIG. 13 is a plan view showing the fourth concave and convex patterns of the substrate shown in FIG. 11.

FIG. 11 is a side sectional view showing a semiconductor light emitting device 200 according to a fourth embodiment, FIG. 12 is a side sectional view showing the fourth lens pattern of the substrate shown in FIG. 11, and FIG. 13 is a plan view showing the fourth lens pattern of the substrate shown in FIG. 11. In the following description about the fourth embodiment, the same reference numerals are assigned to elements identical to the above embodiments, and details thereof will be omitted.

Referring to FIG. 11, the semiconductor light emitting device 200 comprises a substrate 210 having fourth concave and convex patterns 211 and 212, a buffer layer 220, an undoped semiconductor layer 230, a first conductive semiconductor layer 240, an active layer 250, and a second conductive semiconductor layer 260.

The substrate 210 may comprise one selected from the group consisting of $Al_2O_3$, GaN, SiC, ZnO, Si, GaP, and GaAs. According to the present embodiment, the substrate 210 comprising $Al_2O_3$ will be described below.

The fourth concave and convex patterns 211 and 212 are formed on a surface of the substrate 210. The fourth convex pattern 212 has a protrusion structure formed through an etch process. In detail, the fourth convex pattern 212 has a lens shape, a polygonal shape, a conical shape, and an angular structure having a predetermined angle. Hereinafter, the fourth convex pattern 212 having a convex-lens shape will be described as an example. The fourth convex patterns 212 may be periodically or irregularly formed, and may have a diameter of 1 um to 5 um and a thickness of 1 um to 2 um.

A step structure 214 may be formed in the surface of the fourth convex pattern 212 of the substrate 210. As shown in FIGS. 12 and 13, a plurality of step-shape concaves/convexes having a micro size are formed in the step structure 214 of the surface of the fourth convex pattern 212. In this case, although it is shown and described that the step structure 214 is employed only for the surface of the fourth convex pattern 212, the step structure 214 may be employed for the fourth concave pattern 211. In other words, the step structure 214 may be formed in a surface of at least one of the fourth concave and convex patterns 211 and 212.

The step structure 214 of the fourth convex pattern 212 of the substrate 210 is formed when some portions of the fourth convex pattern 212 are separated from the fourth convex pattern 212 due to difference in coupling force relative to an external removal layer (not shown). In this case, [0001] surfaces of the step structure 214 of the fourth convex pattern 212 are exposed to promote the vertical growth. The step structure 214 may have a nano size (e.g., 10 nm to 90 nm).

The buffer layer 220 is formed on the substrate 210. The buffer layer 220 reduces a lattice constant difference from the substrate 210. The buffer layer may selectively comprise GaN, AlN, AlGaN, InGaN, or AlInGaN and have a predetermined thickness (e.g., 150 Å to 1000 Å). The undoped semiconductor layer 230 may be formed on the buffer layer 220. The undoped semiconductor layer 230 may be realized by using an undoped GaN layer. The substrate 210 may be formed thereon with only one of the buffer layer 220 and the undoped semiconductor layer 230, or the above layers may not be formed on the substrate 210.

When the buffer layer 220 is doped with conductive dopants, the buffer layer 220 may have a pattern corresponding to the fourth concave and convex pattern of the substrate 210.

The first conductive semiconductor layer 240 is formed on the undoped semiconductor layer 230. The first conductive semiconductor layer 240 may comprise an N-type semiconductor layer doped with N-type dopants. The N-type semiconductor layer may comprise a semiconductor material, such as InAlGaN, GaN, AlGaN, InGaN, AlN, or InN, having a compositional formula, $In_xAl_yGa_{1-x-y}N$ ($0 \leq x \leq 1, 0 \leq y \leq 1, 0 \leq x+y \leq 1$). The N-type dopants comprise Si, Ge, and Sn.

The first conductive semiconductor layer 240 is formed thereon with the active layer 250. The active layer 250 may have a single quantum well structure or a multiple quantum well structure. A conductive clad layer (not shown) may be formed on and/or under the active layer 250, and realized by using an AlGaN layer.

The second conductive semiconductor layer 260 is formed on the active layer 250. The second conductive semiconductor layer 260 may be realized by using a P-type semiconductor layer doped with P-type dopants. The P-type semiconductor layer may comprise a semiconductor material, such as InAlGaN, GaN, AlGaN, InGaN, AlN, or InN, having a compositional formula, $In_xAl_yGa_{1-x-y}N$ ($0 \leq x \leq 1, 0 \leq y \leq 1, 0 \leq x+y \leq 1$). The P-type dopants comprise Mg, Zn, Ca, Sr, and Ba.

The first conductive semiconductor layer 240 may be formed thereon with a first electrode layer 245, and the second conductive semiconductor layer 260 may be formed with a second electrode layer 265.

In the semiconductor light emitting device 200 according to the fourth embodiment, the fourth concave and convex patterns 211 and 212 are formed on the substrate 210. The fourth convex pattern 212 has the step structure 214 with at least one [0001] surface. Accordingly, the fourth convex pattern 212 having the step structure 214 reduces a critical angle for light extraction to raise light extraction efficiency. Accordingly, external quantum efficiency can be enhanced.

In addition, when the fourth convex pattern 212 and/or the fourth concave pattern 211 of the substrate 210 is formed in the step structure 214 having the [0001] surface, the fourth convex pattern 212 and/or the fourth concave pattern 211 of the substrate 210 can prevent potential bundle from being generated on a nitride semiconductor layer such as the buffer layer 220 grown from the substrate 210, prevent resistance against electrostatic discharge (ESD) from being degraded, and improve the quality of the active layer 250.

FIGS. 14 to 18 are views showing the manufacturing process of the semiconductor light emitting device according to the fourth embodiment.

Figure 14:
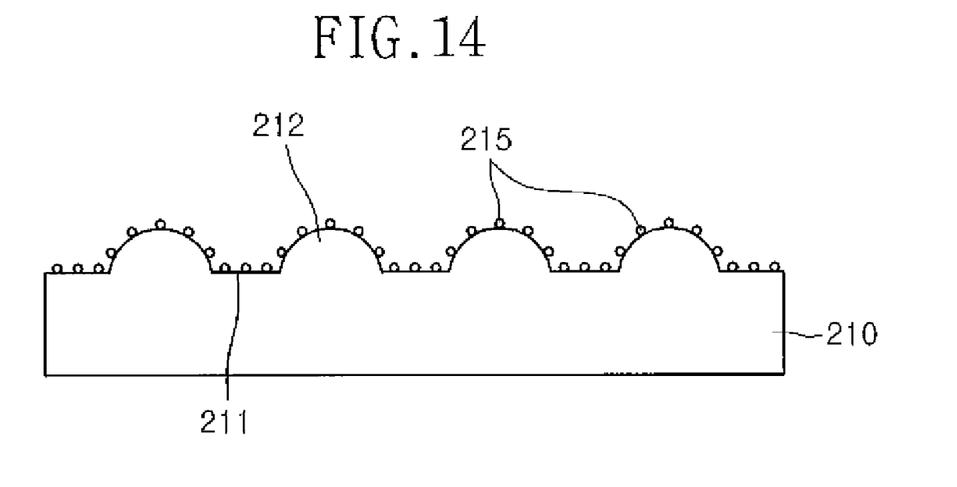
FIGS. 14 to 18 are views showing the manufacturing process of the semiconductor light emitting device according to the fourth embodiment.

Referring to FIG. 14, the fourth concave and convex patterns 211 and 212 are formed on the substrate 210. The substrate 210 may comprise one selected from the group consisting of $Al_2O_3$, GaN, SiC, ZnO, Si, GaP and GaAs. If the substrate 210 comprises a sapphire substrate, the fourth concave and convex patterns 211 and 212 of the sapphire substrate may be formed as a patterned sapphire substrate (PSS) having a convex lens shape through an etch process. The etch process is performed through a dry etch scheme by using equipment for reactive ion etching (RIE), capacitively coupled plasma (CCP), electron cyclotron resonance (ECR), or inductively coupled plasma (ICP).

A removal layer 215 is formed on the fourth concave and convex patterns 211 and 212 of the substrate 210. The removal layer 215 comprises a nitride semiconductor comprising aluminum (Al). For example, the removal layer 215 comprises at least one of AlN, AlInN, AlGaN, and AlInGaN. The removal layer 215 may have a predetermined thickness (e.g., 100-800 Å).

In a growth stage, the removal layer 215 has a grain shape instead of a thin film shape due to a lattice constant difference from a material (e.g., $A_2O_3$) of the substrate 210. In this case, when the removal layer 215 is continuously grown by raising a growth temperature, the removal layer 215 may become a thin film having a thickness of several hundred nm.

When the removal layer 215 is formed at the upper portion of the substrate 210, a growth chamber is subject to a heat treatment process at an atmosphere of HCl under a high temperature. In this case, the removal layer 215 is vaporized so that a portion of the fourth convex pattern 212 is separated from the fourth convex pattern 212.

In addition, when the removal layer 215 is vaporized, a portion of the fourth concave pattern 211 is separated from the fourth concave pattern 211.

Figure 15:
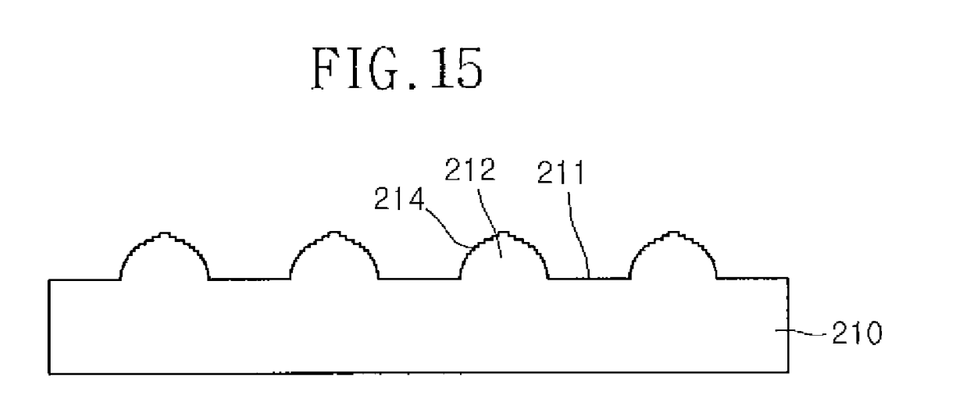

Referring to FIGS. 14 and 15, a plurality of step structures 214 are formed in the surface of the fourth convex pattern 212. Since a [0001] surface is exposed in the step structure 214, a GaN growth surface can be provided on the fourth convex pattern 212. In addition, the step structure may be formed in the surface of the fourth concave pattern 211, and is not limited thereto.

The step structure 214 formed in the surface of the fourth convex pattern 212 has a nano size (e.g., 10 nm to 90 nm). The step structure 214 has a size proportional to a contact area between the removal layer 215 and the fourth convex pattern 212. For example, the size of the step structure 214 may be increased in a direction of an upper portion of the fourth convex pattern 212.

Figure 16:
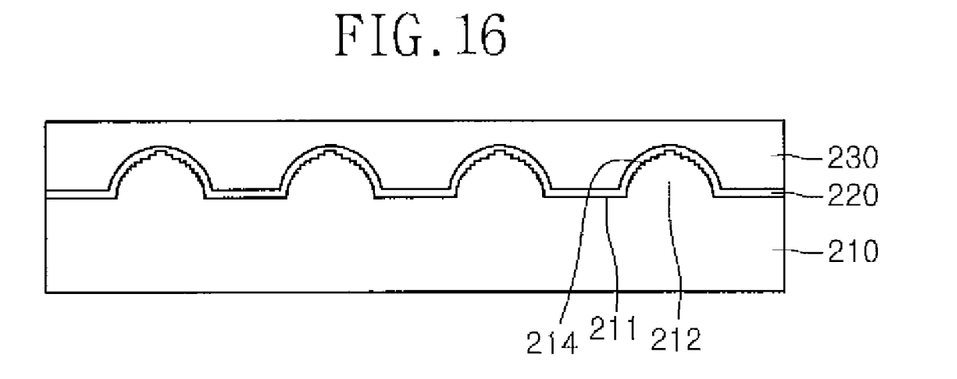

Referring to FIG. 16 the buffer layer 220 is formed on the substrate 210. In other words, the buffer layer 220 is formed on the fourth concave and convex patterns 211 and 212 of the substrate 210. The buffer layer 220 may selectively comprise GaN, AlN, AlGaN, InGaN, and AlInGaN. The buffer layer 220 may have a predetermined thickness (e.g., 150 Å to 1000 Å).

The buffer layer 220 may be formed with the undoped semiconductor layer 230. The undoped semiconductor layer 230 may be realized by using an undoped GaN layer. The substrate 210 may be formed thereon with any one of the buffer layer 220 and the undoped semiconductor layer 230 or the above layers may not be formed on the substrate 210.

Figure 17:
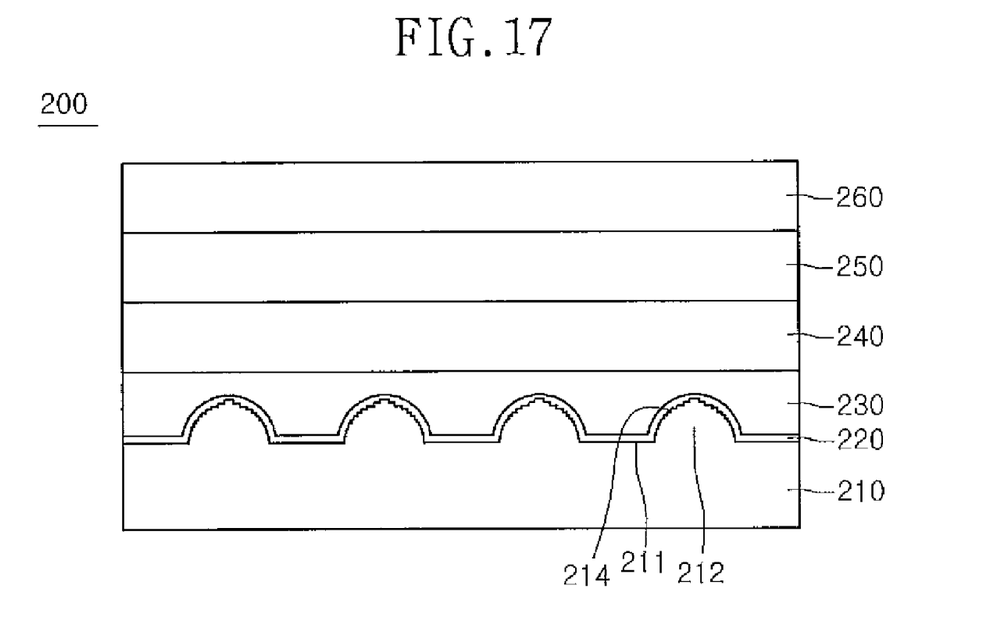

Referring to FIG. 17, the first conductive semiconductor layer 240 is formed on the undoped semiconductor layer 230. The first conductive semiconductor layer 240 may be formed as an N-type semiconductor layer doped with N-type dopants. The N-type semiconductor layer may comprise a semiconductor material having a compositional formula, $In_xAl_yGa_{1-x-y}N$ ($0 \leq x \leq 1$, $0 \leq y \leq 1$, $0 \leq x+y \leq 1$). The N-type dopants comprise Si, Ge, and Sn.

The active layer 250 is formed on the first conductive semiconductor layer 240. The active layer 250 may have a single or multiple quantum well structure. A conductive clad layer (not shown) may be formed on and/or under the active layer 250. The conductive clad layer may be realized as an AlGaN layer.

The second conductive semiconductor layer 260 is formed on the active layer 250. For example, the second conductive semiconductor layer 260 may be realized as a P-type semiconductor layer doped with P-type dopants. The P-type semiconductor layer may comprise a semiconductor material having a compositional formula, $In_xAl_yGa_{1-x-y}N$ ($0 \leq x \leq 1$, $0 \leq y \leq 1$, $0 \leq x+y \leq 1$). The P-type dopants comprise Mg, Zn, Ca, Sr, and Ba.

In this case, an N-type semiconductor layer and/or a transparent electrode layer may be formed on the second conductive semiconductor layer 260.

Figure 18:
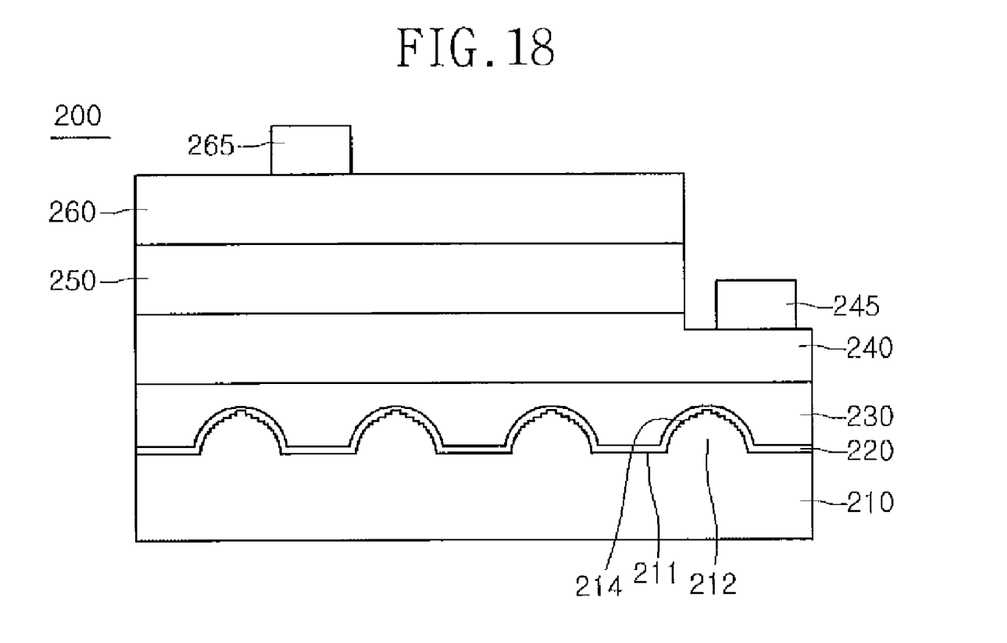

Referring to FIG. 18, after a mesa etching process, the first electrode layer 245 is formed on the first conductive semiconductor layer 240, and the second electrode layer 265 is formed on the second conductive semiconductor layer 260.

Figure 19:
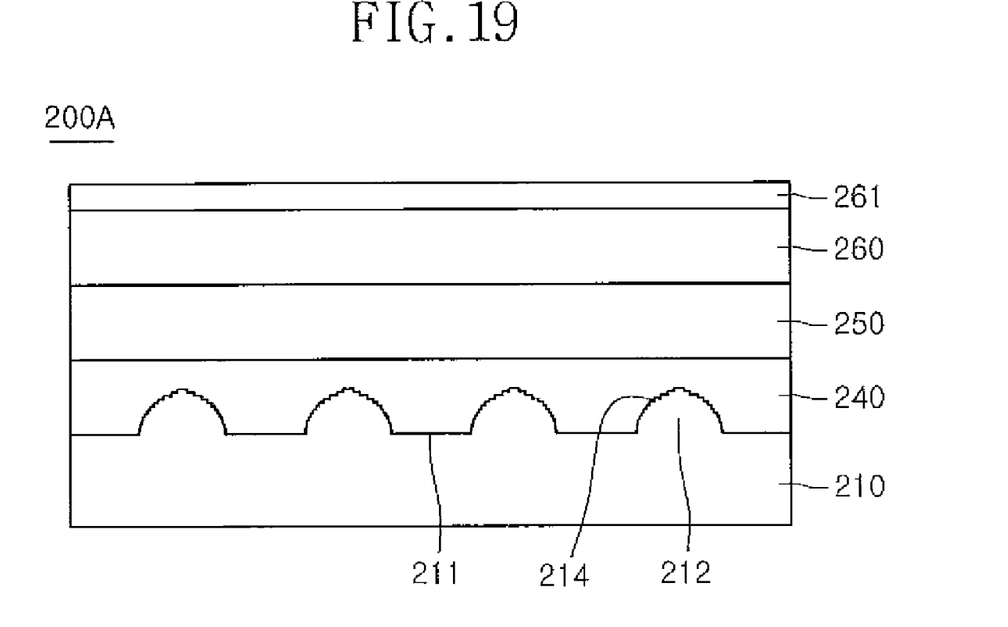
FIG. 19 is a side sectional view showing a semiconductor light emitting device according to a fifth embodiment.

FIG. 19 is a side sectional view showing a semiconductor light emitting device 200A according to a fifth embodiment. In the following description about the fifth embodiment, the same numerals are assigned to elements identical to the fourth embodiment, and details thereof will be omitted.

Referring to FIG. 19, in the semiconductor light emitting device 200A, the substrate 210 is formed thereon with the fourth concave and convex patterns 211 and 212, and the step structure 214 is formed in a surface of the fourth convex pattern 212. A first conductive semiconductor layer 240 is formed on the substrate 210, and a third conductive semiconductor layer 261 is formed on the second conductive semiconductor layer 260.

The removal layer (see 215 of FIG. 14) having a grain shape may not be perfectly removed, but partially remain on the surface of the fourth convex pattern 212 of the substrate 210. In this case, the first conductive semiconductor layer 240 may be effectively stacked on the substrate 210. In other words, the partially remaining removal layer (see 215 of FIG. 14) serves as a seed layer, so that a nitride semiconductor layer may be uniformly stacked over the whole area of the substrate 210.

For example, the first conductive semiconductor layer 240 and the third conductive semiconductor layer 261 may comprise an N-type semiconductor layer doped with N-type dopants. The N-type semiconductor layer may comprise a semiconductor material having a compositional formula, $In_xAl_yGa_{1-x-y}N$ ($0 \leq x \leq 1$, $0 \leq y \leq 1$, $0 \leq x+y \leq 1$). The N-type dopants comprise Si, Ge, and Sn. A transparent electrode layer (not shown) and the second electrode layer may be formed on the third conductive semiconductor layer 261.

Figure 20:
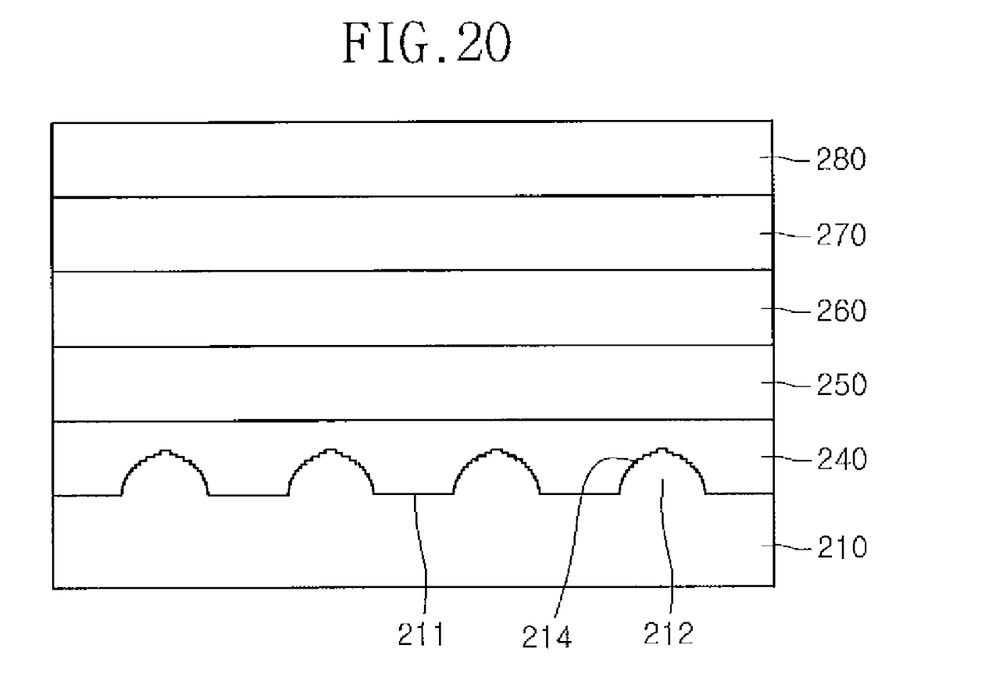
FIGS. 20 to 21 are views showing the manufacturing process of a semiconductor light emitting device according to a sixth embodiment.
Figure 21:
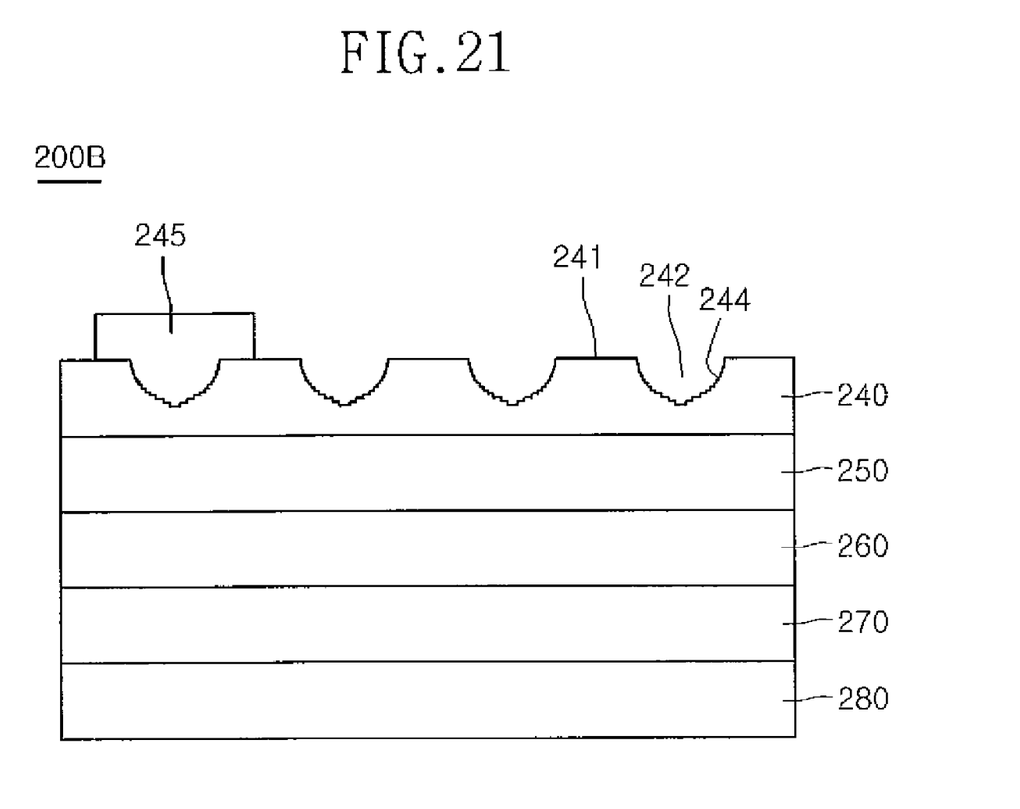

FIGS. 20 and 21 are views showing the manufacturing process of a semiconductor light emitting device according to a sixth embodiment. In the following description about the sixth embodiment, the same reference numerals are assigned to elements identical to the fourth embodiment, and details thereof will be omitted. In addition, the position of "on" or "under" will be explained based on accompanying drawings.

Referring to FIG. 20, the fourth concave and convex patterns 211 and 212 are formed on the substrate 210, and the step structure 214 is formed in a surface of the fourth convex pattern 212.

The substrate 210 is formed thereon with the first conductive semiconductor layer 240, the active layer 250, and the second conductive semiconductor layer 260.

A reflective electrode layer 270 is formed on the second conductive semiconductor layer 260. A conductive support substrate 280 is formed on the reflective electrode layer 270. The reflective electrode layer 270 comprises one of Al, Ag, Pd, Rh, and Pt. The conductive support substrate 280 may comprise Cu or Au, and is not limited thereto.

Thereafter, the substrate 210 is physically and/or chemically separated from the first conductive semiconductor layer 240. For example, the substrate 210 may be separated from the first conductive semiconductor layer 240 through a laser lift off (LLO) scheme.

Referring to FIG. 21, the conductive support substrate 280 is provided at a lower portion of the semiconductor light emitting device 200B, and the first conductive semiconductor layer 240 is formed at an upper portion of the semiconductor light emitting device 200B.

The first electrode layer 245 is formed on the first conductive semiconductor layer 240.

Fifth concave and convex patterns 241 and 242 corresponding to the fourth concave and convex patterns 211 and 212 of the separated substrate 210 are formed at the upper portion of the first conductive semiconductor layer 240. The fifth concave pattern 241 has a concave lens shape, and the fifth convex pattern 242 has a flat shape.

The step structure 244 is formed on the surface of the fifth concave pattern 242. In other words, the surface of the fifth concave pattern 242 of the first conductive semiconductor layer 240 is formed in the step structure 244, so that external quantum efficiency can be enhanced.

The semiconductor light emitting device according to the first to sixth embodiments is adaptable for another embodiment. For example, the structure according to the first embodiment is adaptable for another embodiment. Although it is described that the semiconductor light emitting device has an N—P junction structure, an N—P—N junction structure, a P—N junction structure, and a P—N—P junction structure can be used.

In the above description of the embodiment, when a layer (film) a region, a pattern or an element is referred to as being "on/under" another layer (film) another region, another pattern, or another element, it can be directly "on/under" the other layer (film), the other region, the other pattern, or the other element, or intervening layers (films), regions, patterns, or elements may also be present. Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a first conductive semiconductor layer comprising a first concave-convex pattern;
a second concave-convex pattern on at least one pattern of the first concave-convex pattern;
an active layer on the first conductive semiconductor layer, wherein the active layer includes a single or multiple quantum well structure; and
a second conductive semiconductor layer on the active layer,
wherein the first conductive semiconductor layer, the active layer and the second conductive semiconductor layer are formed of a semiconductor material.

2. The semiconductor light emitting device of claim 1, wherein the second concave-convex pattern is formed with a nano size on a surface of a first convex pattern of the first concave-convex pattern.

3. The semiconductor light emitting device of claim 1, wherein the second concave-convex pattern comprises a micro-lens shape on a surface of a first convex pattern of the first concave-convex pattern.

4. The semiconductor light emitting device of claim 1, comprising a substrate under the first conductive semiconductor layer, the substrate comprising a third concave-convex pattern corresponding to the first concave-convex pattern.

5. The semiconductor light emitting device of claim 4, wherein a first convex pattern of the first convex-concave pattern or a third convex pattern of a third convex-concave pattern comprises at least one of a lens shape, a polygonal shape, a conical shape, and a stripe shape.

6. The semiconductor light emitting device of claim 1, comprising at least one of a second electrode layer, a transparent layer, a reflective electrode layer, and a third conductive semiconductor layer on the second conductive semiconductor layer.

7. The semiconductor light emitting device of claim 1, wherein the second concave-convex pattern comprises a nitride semiconductor.

8. The semiconductor light emitting device of claim 4, wherein the third convex pattern of a third concave-convex pattern of the substrate comprises a step-type concave-convex structure comprising a [0001] surface.

9. A semiconductor light emitting device, comprising:
a substrate comprising a first concave-convex pattern;
a second concave-convex pattern on the first concave-convex pattern;
a first conductive semiconductor layer on the substrate;
an active layer on the first conductive semiconductor layer, wherein the active layer includes a single or multiple quantum well structure; and
a second conductive semiconductor layer on the active layer,
wherein the first conductive semiconductor layer, the active layer and the second conductive semiconductor layer are formed of a semiconductor material.

10. The semiconductor light emitting device of claim 9, wherein the second concave-convex pattern is formed on a surface of the first concave-convex pattern in a nano size using a nitride semiconductor.

11. The semiconductor light emitting device of claim 9, wherein the second concave-convex pattern comprise a step-type concave-convex pattern.

12. The semiconductor light emitting device of claim 9, wherein a buffer layer is interposed between the substrate and the first conductive semiconductor layer and the buffer layer is formed as a concave-convex pattern type.

13. The semiconductor light emitting device of claim 9, wherein a first convex pattern of the first concave-convex pattern comprises at least one of a lens shape, a polygonal shape, a conical shape, and a stripe shape, and the second concave-convex pattern comprises a random micro-lens shape on a surface of the convex pattern.

14. The semiconductor light emitting device of claim 9, wherein the substrate comprises one selected from the group consisting of Al2O3, GaN, SiC, ZnO, Si, GaP, and GaAs, and at least one of a buffer layer and an undoped semiconductor layer is interposed between the substrate and the first conductive semiconductor layer.

15. The semiconductor light emitting device of claim 4, wherein the first concave-convex pattern is formed from the substrate.

16. The semiconductor light emitting device of claim 1, wherein the first and second concave-convex patterns have a different shape.

17. The semiconductor light emitting device of claim 1, wherein the second concave-convex pattern randomly protrudes from a convex pattern of the first concave-convex pattern.

18. The semiconductor light emitting device of claim 9, wherein the first concave-convex pattern is formed from the substrate.

19. The semiconductor light emitting device of claim 9, wherein the first and second concave-convex patterns have a different shape.

20. The semiconductor light emitting device of claim 9, wherein the second concave-convex pattern randomly protrudes from a convex pattern of the first concave-convex pattern.

21. A semiconductor light emitting device, comprising:
a first conductive semiconductor layer comprising a first concave-convex pattern;
a second concave-convex pattern on at least one pattern of the first concave-convex pattern;
an active layer on the first conductive semiconductor layer; and
a second conductive semiconductor layer on the active layer,
wherein the second concave-convex pattern is formed with a nano size on a surface of a first convex pattern of the first concave-convex pattern.

22. A semiconductor light emitting device, comprising:
a substrate comprising a first concave-convex pattern;
a second concave-convex pattern on the first concave-convex pattern;
a first conductive semiconductor layer on the substrate;
an active layer on the first conductive semiconductor layer; and
a second conductive semiconductor layer on the active layer, wherein the second concave-convex pattern is formed on a surface of the first concave-convex pattern in a nano size using a nitride semiconductor.

* * * * *